(12) United States Patent
Kimbel et al.

(10) Patent No.: US 6,203,611 B1
(45) Date of Patent: Mar. 20, 2001

(54) METHOD OF CONTROLLING GROWTH OF A SEMICONDUCTOR CRYSTAL TO AUTOMATICALLY TRANSITION FROM TAPER GROWTH TO TARGET DIAMETER GROWTH

(75) Inventors: Steven L. Kimbel; Robert R. Wyand, III, both of St. Charles, MO (US)

(73) Assignee: MEMC Electronic Materials, Inc., St. Peters, MO (US)

( * ) Notice: Subject to any disclaimer, the term of this patent is extended or adjusted under 35 U.S.C. 154(b) by 0 days.

(21) Appl. No.: 09/421,187

(22) Filed: Oct. 19, 1999

(51) Int. Cl.$^7$ .................................................. C30B 15/26
(52) U.S. Cl. ................................ 117/15; 117/13; 117/14; 117/201; 117/202; 117/932
(58) Field of Search ................................ 117/15, 14, 13, 117/201, 202, 932

(56) References Cited

U.S. PATENT DOCUMENTS

| | | | |
|---|---|---|---|
| 4,973,377 | 11/1990 | Katsuoka et al. | 156/601 |
| 5,178,720 | 1/1993 | Frederick | 156/618 |
| 5,223,078 | 6/1993 | Maeda et al. | 156/601 |
| 5,288,363 | * 2/1994 | Araki | 117/15 |
| 5,487,355 | * 1/1996 | Chiou st al. | 117/15 |
| 5,653,799 | 8/1997 | Fuerhoff | 117/14 |
| 5,665,159 | 9/1997 | Fuerhoff | 117/201 |
| 5,762,704 | * 6/1998 | Matsubara et al. | 117/15 |
| 5,846,318 | 12/1998 | Javidi | 117/14 |
| 5,882,402 | 3/1999 | Fuerhoff | 117/201 |
| 5,961,716 | * 10/1999 | White et al. | 117/15 |

OTHER PUBLICATIONS

"Computer Simulation and Controlled Growth of Large Diameter Czochralski Silicon Crystals," Kim et al., J. Electrochem Society, May 1983, pp. 1156–1160.

"An Analytical Representation of the Shape of the Meniscus In Czochralski Growth," D.T.J. Hurle, Journal of Crystal Growth, 1983, pp. 13–17.

* cited by examiner

*Primary Examiner*—Robert Kunemund
(74) *Attorney, Agent, or Firm*—Senniger, Powers, Leavitt & Roedel

(57) ABSTRACT

A control method for use with a Czochralski crystal puller. The method includes pulling the growing crystal from the melt at a first target pull rate to grow a taper portion of the crystal and measuring the crystal diameter of the taper. The method also includes estimating a slope of the diameter as a function of a change in crystal diameter relative to time and the first target pull rate. The method further includes predicting a crystal diameter $D_i$ at which to initiate body growth from the taper as a function of the estimated slope. By increasing the pull rate to a second target pull rate when the measured crystal diameter reaches the predicted crystal diameter $D_i$, the method controls growth of the crystal for transitioning from taper growth to body growth. The method also determines the second target pull rate as a function of the estimated slope when using a predefined diameter $D_i$ at which to initiate growth of the crystal body.

13 Claims, 6 Drawing Sheets

METHOD OF CONTROLLING GROWTH OF A SEMICONDUCTOR CRYSTAL TO AUTOMATICALLY TRANSITION FROM TAPER GROWTH TO TARGET DIAMETER GROWTH

BACKGROUND OF THE INVENTION

This invention relates generally to improvements in controlling growth processes of single crystal semiconductors for use in the manufacture of electronic components and, particularly, to a method for accurately controlling growth in a Czochralski crystal growth process for transitioning from taper growth to target diameter growth.

Monocrystalline, or single crystal, silicon is the starting material in most processes for fabricating semiconductor electronic components. Crystal pulling machines employing the Czochralski process produce the majority of single crystal silicon. Briefly described, the Czochralski process involves melting a charge of high-purity polycrystalline silicon in a quartz crucible located in a specifically designed furnace. After the heated crucible melts the silicon charge, a crystal lifting mechanism lowers a seed crystal into contact with the molten silicon. The mechanism then withdraws the seed to pull a growing crystal from the silicon melt.

After formation of a crystal neck, the growth process enlarges the diameter of the growing crystal in a cone-shaped manner by decreasing the pulling rate and/or the melt temperature until a desired diameter is reached. This portion of the crystal is typically referred to as the crown or taper. By controlling the pull rate and the melt temperature while compensating for the decreasing melt level, the main body of the crystal is grown so that it has an approximately constant diameter (i.e., it is generally cylindrical). Near the end of the growth process but before the crucible is emptied of molten silicon, the process gradually reduces the crystal diameter to form an end cone. Typically, the end cone is formed by increasing the crystal pull rate and heat supplied to the crucible. When the diameter becomes small enough, the crystal is then separated from the melt. During the growth process, the crucible rotates the melt in one direction and the crystal lifting mechanism rotates its pulling cable, or shaft, along with the seed and the crystal, in an opposite direction.

Although presently available Czochralski growth processes have been satisfactory for growing single crystal silicon useful in a wide variety of applications, further improvements are still desired. For example, it is desired to provide more accurate transitions from taper growth to the body target diameter.

The conventional method for transitioning from taper growth to body growth involves increasing the crystal lift rate. This causes a change in the rate of diameter increase, from some positive value to nearly zero, or even a slightly negative value. The conventional transitioning method intends to arrive at a steady-state diameter value for essentially straight crystal growth that is equal to a crystal target diameter. Currently, this transition occurs at a fixed, predetermined taper diameter regardless of the conditions inside the crystal grower. In the alternative, an operator decides when to initiate the transition. Unfortunately, the differing experience levels of various operators, in addition to differing thermal conditions inside the crystal grower, produce different taper growth rates. For this reason, the conventional methods for initiating the transition to body growth often produce differing results from one crystal growth run to another. In one instance the initial crystal body may be grown with too small of a diameter but the initial body may be grown with too large of a diameter in another. Specifically, there is often a relatively large standard deviation in crystal diameter in the early body growth compared to the desired target diameter for the crystal. This requires correction by the control system during the remainder of the body growth. Moreover, if a crystal is unacceptably undersized in its early body growth, then significant portions will be unusable for semiconductor wafer fabrication.

For these reasons, an accurate and reliable apparatus and method for controlling silicon crystal growth to automatically transition from taper growth to target diameter growth is desired.

SUMMARY OF THE INVENTION

The invention meets the above needs and overcomes the deficiencies of the prior art by providing a method for automatically transitioning from taper growth to target diameter growth in a crystal ingot pulled from a melt according to the Czochralski process. Among the several objects of the invention may be noted the provision of such method that permits more accurate taper to body transitions; the provision of such method that provides repeatable results; the provision of such method that significantly lowers the initial diameter standard deviation between crystals; the provision of such method that predicts the diameter at which to begin the transition to straight crystal growth; the provision of such method that may be incorporated into the controls of an existing crystal pulling device; and the provision of such method that can be carried out efficiently and economically.

Briefly described, a control method embodying aspects of the invention is for use with a crystal puller for growing a monocrystalline semiconductor crystal according to the Czochralski process. The crystal puller has a heated crucible containing a semiconductor melt from which the crystal is grown. The crystal is grown on a seed crystal pulled from the melt. The method includes the step of pulling the growing crystal from the melt at a first target pull rate. The first target pull rate substantially follows an initial velocity profile for growing a taper portion of the crystal. In the taper portion, the crystal has a generally increasing diameter. The method also includes measuring the crystal diameter of the taper and estimating a slope of the diameter. The estimated slope is a function of a change in crystal diameter relative to time and the first target pull rate. The method further includes the step of predicting a crystal diameter measurement $D_i$ at which to initiate shouldering as a function of the estimated slope. After shouldering, the body of the crystal has a substantially uniform diameter greater than the predicted shouldering initiation diameter measurement $D_i$. By increasing the pull rate by an increment k to a second target pull rate when the measured crystal diameter reaches the predicted crystal diameter measurement $D_i$, the method utilizes the natural response of the crystal plus the measurement bias for more accurate transitioning from taper growth to body growth.

Another embodiment of the invention is directed to a control method for use with a crystal puller for growing a monocrystalline semiconductor crystal according to the Czochralski process. The crystal puller has a heated crucible containing a semiconductor melt from which the crystal is grown. The crystal is grown on a seed crystal pulled from the melt. The method includes the step of pulling the growing crystal from the melt at a first target pull rate. The first target pull rate substantially follows an initial velocity profile for growing a taper portion of the crystal. In the taper portion, the crystal has a generally increasing diameter. The method also includes measuring the crystal diameter of the taper and estimating a slope of the diameter. The estimated slope is a function of a change in crystal diameter relative to time and the first target pull rate. The method further includes the step of predefining a crystal diameter measurement $D_i$ at which to initiate a transition to a body portion of the crystal from the taper. The body of the crystal has a substantially uniform diameter greater than the predefined diameter measurement $D_i$. The method also includes determining an increment of the pull rate that corresponds to an accurate transition into body growth as a function of the estimated slope and one or more hotzone parameters. By increasing the pull rate to the second target pull rate when the measured crystal diameter reaches the predefined crystal diameter measurement $D_i$, the method utilizes the natural response of the crystal plus the measurement bias for more accurate transitioning from taper growth to body growth.

Alternatively, the invention may comprise various other methods and systems.

Other objects and features will be in part apparent and in part pointed out hereinafter.

BRIEF DESCRIPTION OF THE DRAWINGS

Corresponding reference characters indicate corresponding parts throughout the drawings.

DETAILED DESCRIPTION OF PREFERRED EMBODIMENTS

Figure 1:
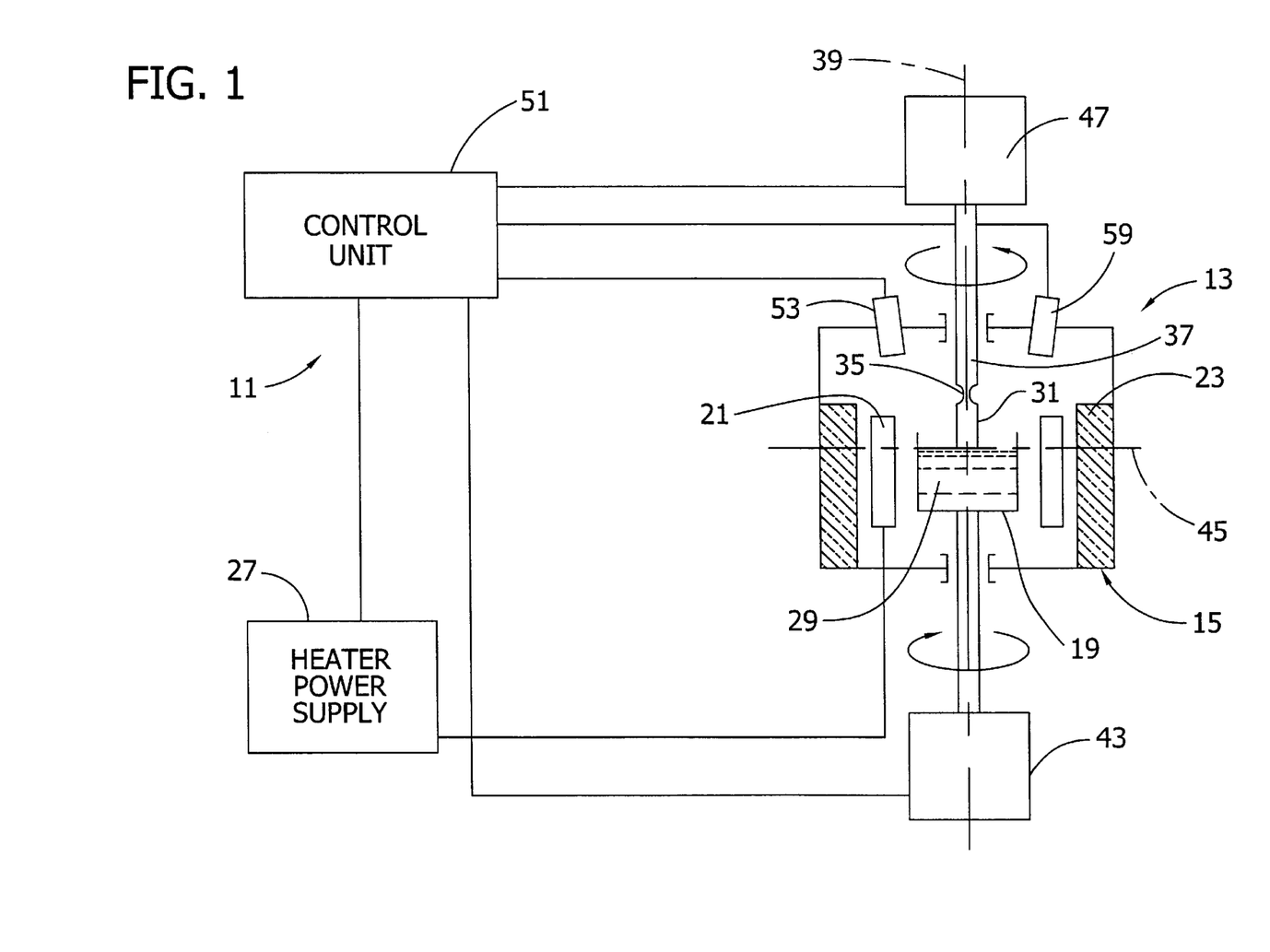
FIG. 1 is a partially schematic, block diagram illustrating a crystal puller and an apparatus according to the present invention for controlling the crystal puller.

Referring now to FIG. 1, a control apparatus, indicated generally at 11, is shown for use with a Czochralski crystal growing apparatus, indicated generally at 13. The details of construction of the crystal growing apparatus, or puller, 13 are well known to those of ordinary skill in the art. In general, the crystal puller 13 includes a vacuum chamber 15 enclosing a crucible 19. Heating means such as a resistance heater 21 surrounds the crucible 19. In one embodiment, insulation 23 lines the inner wall of vacuum chamber 15 and a chamber cooling jacket (not shown) fed with water surrounds it. A vacuum pump (not shown) typically removes gas from within the vacuum chamber 15 as an inert atmosphere of argon gas is fed into it.

According to the Czochralski single crystal growth process, a quantity of polycrystalline silicon, or polysilicon, is charged to crucible 19. A heater power supply 27 provides electric current through the resistance heater 21 to melt the charge and, thus, form a silicon melt 29 from which a single crystal 31 is pulled. As is known in the art, the single crystal 31 starts with a seed crystal 35 attached to a pull shaft, or cable, 37. As shown in FIG. 1, single crystal 31 and crucible 19 generally have a common axis of symmetry 39. During both heating and crystal pulling, a crucible drive unit 43 rotates crucible 19 (e.g. in the clockwise direction). The crucible drive unit 43 also raises and lowers crucible 19 as desired during the growth process. For example, crucible drive unit 43 raises crucible 19 as the melt 29 is depleted to maintain its level, indicated by reference character 45, at a desired height. A crystal drive unit 47 similarly rotates the cable 37 and, thus, rotates crystal 31, in a direction opposite the direction in which crucible drive unit 43 rotates crucible 19. In addition, the crystal drive unit 47 raises and lowers crystal 31 relative to the melt level 45 as desired during the growth process. The details of construction of crucible drive unit 43 and crystal drive unit 47 are well known to those of ordinary skill in the art.

In one embodiment, crystal puller 13 first preheats the seed crystal 35 by lowering it nearly into contact with the molten silicon of melt 29 contained by crucible 19. After preheating, crystal drive unit 47 continues to lower seed crystal 35 via cable 37 into contact with melt 29 at its melt level 45. As seed crystal 35 melts, crystal drive unit 47 slowly withdraws, or pulls, it from the melt 29. Seed crystal 35 draws silicon from melt 29 to produce a growth of silicon single crystal 31 as it is withdrawn. Crystal drive unit 47 rotates crystal 31 at a reference rate as it pulls crystal 31 from melt 29. Crucible drive unit 43 similarly rotates crucible 19 at another reference rate, but usually in the opposite direction relative to crystal 31.

A control unit 51 initially controls the withdrawal, or pull, rate and the power that power supply 27 provides to heater 21 to cause a neck down of crystal 31. Preferably, crystal puller 13 grows the crystal neck at a substantially constant diameter as seed crystal 35 is drawn from melt 29. For example, the control unit 51 maintains a substantially constant neck diameter of about five percent of the desired body diameter. Under a conventional control scheme, control unit 51 adjusts the rotation, pull and/or heating parameters after the neck reaches a desired length to cause the diameter of crystal 31 to increase in a cone-shaped manner until a desired crystal body diameter is reached. For example, control unit 51 decreases the pull rate according to an initial velocity profile to create an outwardly flaring region typically referred to as the taper of the crystal. Commonly assigned application Ser. No. 09/287,916, filed Apr. 7, 1999, the entire disclosure of which is incorporated herein by reference, discloses a closed loop method and system for accurately controlling taper growth in a Czochralski crystal growth process.

As described in detail below, control unit 51 calculates the slope of the taper (and hence, knowing the mean seed lift rate, the diameter growth rate may be computed) using an estimate of the rate of change of the diameter slope. Based on these calculations, control unit 51 predicts a desired crystal diameter for initiating the transition from taper growth to body growth. Control unit 51 then controls the growth parameters to maintain a relatively constant diameter as measured by apparatus 11 until the process approaches its end. At that point, the pull rate and heating are usually increased for decreasing the diameter to form an end cone, i.e., a tapered portion at the end of single crystal 31. Once the diameter of the end cone is sufficiently small (e.g., 2 mm to 4 mm), detachment of crystal 31 from melt 29 can be accomplished without causing dislocations to spread to the main body of crystal 31. Crystal 31 is then removed from vacuum chamber 15 for processing into wafers. Commonly assigned U.S. Pat. No. 5,178,720, the entire disclosure of which is incorporated herein by reference, discloses a preferred method for controlling crystal and crucible rotation rates as a function of the crystal diameter.

Preferably, control unit 51 operates in combination with at least one two-dimensional camera 53 to determine a plurality of parameters of the growth process including the crystal diameter. Camera 53 is mounted above a viewport (not shown) of chamber 15 and aimed generally at the intersection of longitudinal axis 39 and melt level 45 (see FIG. 5). In addition to processing signals from camera 53, control unit 51 processes signals from other sensors. For example, a temperature sensor 59, such as a radiation pyrometer, may be used to measure the melt surface temperature.

Figure 2:
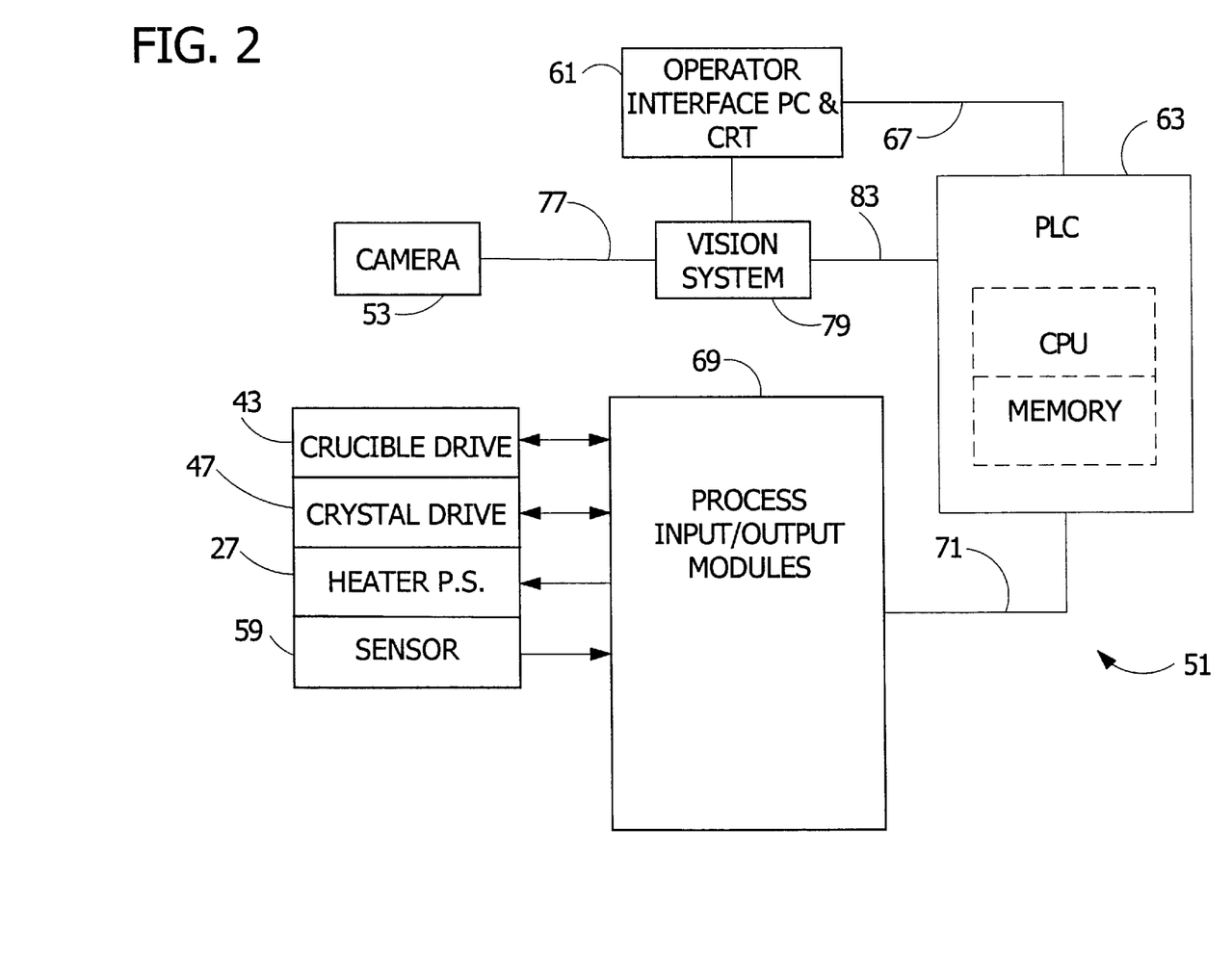
FIG. 2 is a block diagram of a control unit of the system of FIG. 1.

FIG. 2 illustrates a preferred embodiment of control unit 51 in block diagram form. Control unit 51 includes a programmed digital or analog computer 61 for use in controlling, among other things, crucible drive unit 43, single crystal drive unit 47 and heater power supply 27 as a function of processed signals from camera 53 and other sensors. As shown in FIG. 2, a programmable logic controller (PLC) 63 communicates with the computer 61 via line 67 (e.g., RS-232 cable) and with one or more process input/output modules 69 via line 71 (e.g., RS-485 cable). According to the invention, computer 61 provides an operator interface that permits the operator of the crystal growing apparatus 13 to input a set of desired parameters for the particular crystal being grown.

The process input/output module 69 provides a path to and from crystal puller 13 for controlling the growth process. As an example, the PLC 63 receives information regarding the melt temperature from temperature sensor 59 and outputs a control signal to heater power supply 27 via process input/output module 69 for controlling the melt temperature thereby controlling the growth process.

Referring further to FIG. 2, camera 53 communicates video images of the interior of crucible 19 via line 77 (e.g., RS-170 video cable) to a vision system 79 providing edge detection and diameter measurement calculations. In turn, vision system 79 communicates with PLC 63 via line 83. In one preferred embodiment, PLC 63 is a Model TI 575 PLC manufactured by Siemens or a Model 545 PLC manufactured by Texas Instruments and line 83 represents a communications interface (e.g., VME backplane interface). Depending on the particular controller embodying PLC 63, the communications interface 83 may be, for example, a custom VME rack that includes an additional communications board (e.g., Model 2571 Program Port Expander Module using the RS-422 serial bidirectional PLC port).

Figure 3:
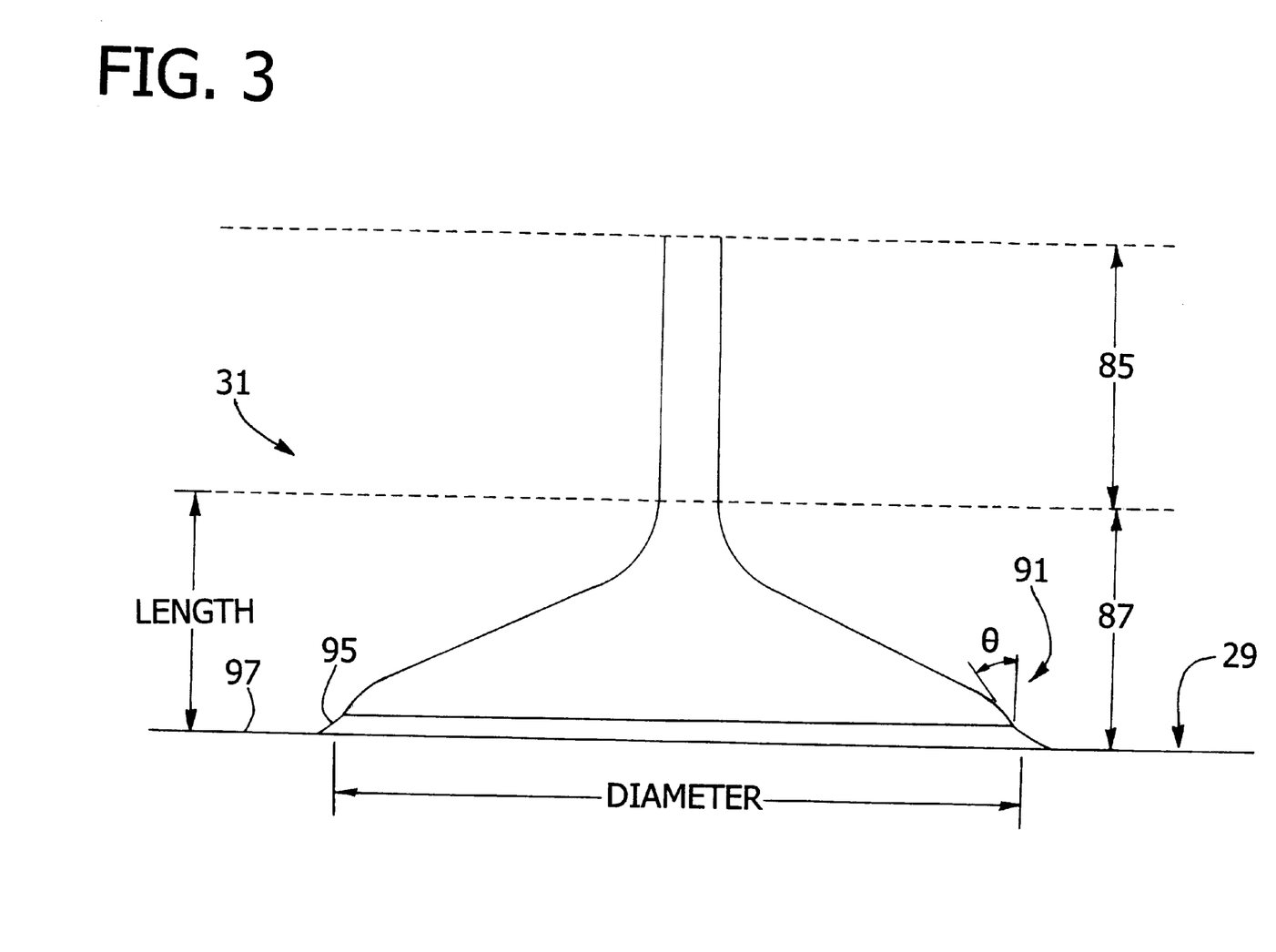
FIG. 3 is a schematic, fragmentary view of taper growth of a semiconductor crystal being pulled from a melt contained in the crystal puller of FIG. 1.

FIG. 3 illustrates a relatively early phase of the crystal growth process following melt-down and dipping of seed crystal 35. After formation of a crystal neck 85, the typical process enlarges the diameter of the growing crystal 31 by decreasing the pulling rate and/or the melt temperature until a desired diameter is reached. This portion of increasing diameter is referred to as a taper, or crown, 87. As the taper 87 increases to a desired diameter, crystal 31 forms a shoulder, indicated generally at 91, followed by a main body (not shown in FIG. 3). As the crystal drive unit 47 pulls crystal 31 from melt 29, a liquid meniscus 95 forms at the interface between crystal 31 and melt 29. The liquid meniscus 95 forms on a surface 97 of melt 29. As is known in the art, the reflection of crucible 19 on meniscus 95 is often visible as a bright ring adjacent crystal 31.

It should be understood that the as-grown crystal body typically will not have an entirely uniform diameter, although it is generally cylindrical. For this reason, the diameter of crystal 31 may vary slightly at different axial positions along axis 39. Further, the diameter varies in the different phases of crystal growth (i.e., seed, neck, taper, body and end cone). Although described in connection with vision system 79, it is to be further understood that crystal diameter measurements may be determined by a number of methods. For example, several technologies are known for providing crystal diameter measurements including methods that claim to measure the width of the bright ring. The bright ring is a characteristic of the reflection of the crucible wall in the meniscus that is formed at the solid-liquid interface of crystal 31. Conventional bright ring and meniscus sensors employ optical pyrometers, photocells, rotating mirrors with photocells, light sources with photocells, line-scan cameras, and two-dimensional array cameras. Commonly assigned U.S. Pat. Nos. 5,665,159 and 5,653,799, the entire disclosures of which are incorporated herein by reference, describe a system and method, respectively, for accurately and reliably measuring crystal diameter for use in controlling the growth process of single crystal silicon. Advantageously, the system and method of these patents accurately determine the growing crystal's diameter by processing images of the crystal-melt interface generated by a camera.

According to a preferred embodiment of the present invention, PLC 63 processes seed lift rate and taper diameter data to calculate the slope of taper 87. This information yields data representing the crystal growth rate. In addition, PLC 63 calculates the rate of change of the taper slope. Based on these calculations, PLC 63 advantageously predicts a crystal diameter at which transition from taper growth to body growth is desired based on the current values of the diameter and diameter slope computation and, thus, based on the current conditions in puller 13. This gives repeatable, more accurate transitions from taper 87 to the body of crystal 31, and significantly lowers the initial diameter standard deviation.

In this embodiment, PLC 63 executes routines to compute an optimal shoulder roll, requiring minimal control changes. To derive the shoulder initiation equation, first assume that the diameter slope responds with a well known first order system plus delay model. By first ignoring the delay, a state-space representation of the Laplace Transform process model may be generated:

$$\frac{D(s)}{V_P(s)} = \frac{G_P}{s(s\tau+1)} \Rightarrow \left\{ \begin{array}{c} \dot{x}(t) = \begin{bmatrix} 0 & 1 \\ 0 & -1/\tau \end{bmatrix} x(t) + \begin{bmatrix} 0 \\ 1/\tau \end{bmatrix} V_P(t) \equiv Ax(t) + BV_P(t) \\ D(t) = [G_P \; 0]x(t) = Cx(t) \end{array} \right\}.$$

By the variation of constants (VOC) formula taught by C. T. Chen, LINEAR SYSTEM THEORY AND DESIGN 1-227 (Oxford University Press) (1984), $$x(t) = \Phi(t, t_0)x(t_0) + \int_{t_0}^{t} \Phi(t, \xi) BV_p \, d\xi,$$

where:

$$\Phi(t, \xi) = e^{A(t-\xi)} = \begin{bmatrix} 1 & \tau\left(1 - e^{\frac{-(t-\xi)}{\tau}}\right) \\ 0 & e^{\frac{-(t-\xi)}{\tau}} \end{bmatrix}$$

by series expansion, inverse Laplace transform ($e^{At}=L^{-1}\{(sI-A)^{-1}\}$), or other methods. For an open-loop predictive shoulder roll, it is desirable to increment the pull rate $V_P$ by a constant value, namely, k, such that the desired target diameter $D_t$ is reached with zero slope. Even if the loop is closed, a computed set point for $V_P$ during shouldering may be desired. During crown growth, a shoulder initiation diameter $D_i$ is measured periodically, with a slope $\dot{D}_i$ interpreted. If the desired final slope is zero, then the VOC formula provides the relation:

$$\frac{1}{G_P}\left\{\begin{bmatrix} D_t \\ 0 \end{bmatrix} - \begin{bmatrix} 1 & \tau\left(1-e^{\frac{-T}{\tau}}\right) \\ 0 & e^{\frac{-T}{\tau}} \end{bmatrix}\begin{bmatrix} D_i \\ \dot{D}_i \end{bmatrix}\right\} = \int_0^T \begin{bmatrix} 1-\tau\left(1-e^{\frac{-(T-\xi)}{\tau}}\right) \\ \frac{1}{\tau}e^{\frac{-(T-\xi)}{\tau}} \end{bmatrix} k\, d\xi.$$

Since $$\int_0^T e^{\frac{-(T-\xi)}{\tau}} d\xi = \tau e^{\frac{-(T-\xi)}{\tau}} \Big|_0^T = \tau\left(1-e^{\frac{-T}{\tau}}\right),$$

the relation noted above yields two formulas, namely:

$$-\frac{\dot{D}_i}{G_P} e^{\frac{-T}{\tau}} = k\left(1-e^{\frac{-T}{\tau}}\right)$$

and $$G_P k\left[T - \tau\left(1-e^{\frac{-T}{\tau}}\right)\right] = \left[D_t - D_i - \tau\left(1-e^{\frac{-T}{\tau}}\right)\dot{D}_i\right].$$

Assuming that $T = -\tau \ln(Z)$, simplifying the first formula gives:

$$T = -\tau \ln\left(\frac{k}{k - \dot{D}_i/G_P}\right)$$

after solving for, and then eliminating, Z. Substituting this value of T into the second equation above results in an estimated diameter for initiating the transition from taper growth to body growth. In other words, control unit 51 preferably increases the pull rate set point to the predetermined value k when the diameter of crystal 31 reaches $D_i$, defined by:

$$D_i = D_t - \tau\left\{\dot{D}_i + [G_P k - \dot{D}_i]\left(\frac{k}{k - \dot{D}_i/G_P}\right) - G_P k\left[1 + \ln\left(\frac{k}{k - \dot{D}_i/G_P}\right)\right]\right\}.$$

In this instance, k represents an amount of increase in the pull rate to achieve the desired shoulder roll, $\tau$ is the process time constant in minutes and $G_P$ is the DC process gain in (mm diameter/min)/(mm/min pull rate change).

According to a preferred embodiment of the invention, PLC 63 calculates the estimated diameter $D_i$ for initiating the shoulder roll in response to a predetermined pull rate value of k. It is to be understood that PLC 63 could likewise calculate a desired value of k for selecting the seed lift set point based on a predetermined shoulder transition initiation diameter. In either case, the present invention provides optimal shoulder roll with minimal changes to the control scheme executed by control unit 51.

Although the use of the above equation provides improved results in transitioning from taper growth to body growth, the present invention also accounts for two additional factors in the shoulder roll, namely, the growth of the bright ring during shouldering and any pure time delay associated with the diameter response. PLC 63 preferably uses an a priori approximation to account for the bright ring around crystal 31. A diameter bias DB associated with the formation of the bright ring is approximated by DB=max $(0, \alpha_0 + \alpha_1 \tan\theta + \alpha_2 \tan^2\theta)$, where $\theta$ is the angle of the crown growth relative to vertical (see FIG. 3). First, noting that $DB = \alpha_0$ for vertical body growth, $\Delta DB = DB_{taper} - DB_{body} = \max(-\alpha_0, \alpha_1 \tan\theta + \alpha_2 \tan^2\theta)$, where $\Delta DB$ is the amount that the crown appears smaller than the body diameter when compared with the body diameter. Substituting the relation:

$$\tan\theta = \frac{1}{2V_P}\frac{dD}{dt} = \frac{\dot{D}}{2V_P}$$

yields the following approximation for use in compensating for changes in the width of the bright ring as a function of the diameter slope:

$$\Delta DB = \max\left(-\alpha_0, \frac{\alpha_1}{2}\left(\frac{\dot{D}}{V_P}\right) + \frac{\alpha_2}{4}\left(\frac{\dot{D}}{V_P}\right)^2\right).$$

Appendix A provides a description of bright ring modeling according to a preferred embodiment of the invention for use in determining the diameter bias of the bright ring. In Appendix A, a polynomial equation is used to approximate the bright ring. Appendix B provides an exemplary program for use with Matlab® software for performing the calculations of Appendix A. Preferably, control unit 51 executes the program to perform numerical searching to calculate $\tan\theta$ to enable an approximation of the bright ring with a quadratic. It is to be understood that other software may be used for performing this function (e.g., Mathcad® or Lotus® software).

The PLC 63 further improves the estimated diameter for initiating the transition by accounting for pure time delay with a time delay approximation. This provides a more accurate model of the process. In general, the time delay represents the amount of time required following a control change before any change in the output can be detected. Specifically, the time delay represents the time that the crown may continue to grow at the same rate after a change in the pull rate set point is made until the change begins to take effect. In a model such as:

$$\frac{D(s)}{V_P(s)} = \frac{G_P e^{-st_d}}{s(s\tau+1)},$$

the parameter $t_d$ is a pure time delay, such that no change in the bright ring diameter slope measurement occurs until $t_d$ after a change in the pull rate. In this case, the diameter of crystal 31 grows by $\Delta D \approx \dot{D}_i t_d$ during the time delay, and the shoulder initiation point is therefore to be reduced by this quantity for a more accurate final diameter.

Summing each of the above components gives a final formula for the optimum shoulder roll initiation, given a desired increase in pull rate during shouldering represented by k, a current measure of the diameter $D_i$, and a current estimate of the diameter slope $\dot{D}_i$:

$$D_i = D_t - \tau\left\{\dot{D}_i + [G_P k - \dot{D}_i]\left(\frac{k}{k - \dot{D}_i/G_P}\right) - G_P k\left[1 + \ln\left(\frac{k}{k - \dot{D}_i/G_P}\right)\right]\right\} + \max\left(-\alpha_0, \frac{\alpha_1}{2}\left(\frac{\dot{D}}{V_P}\right) + \frac{\alpha_2}{4}\left(\frac{\dot{D}}{V_P}\right)^2\right) - \dot{D}_i t_d.$$

Note that when crown/shoulder data is used to generate the values of $G_P$, $\tau$, and $t_d$ that the bright ring function should first be subtracted from the measured diameter data to provide more accurate process response measurements. Additionally, the bright ring, being a reflection of the bright wall of crucible 19 on the reflective meniscus, varies by hotzone configuration, melt level and the like, and should be modeled uniquely for such variations.

Figure 4:
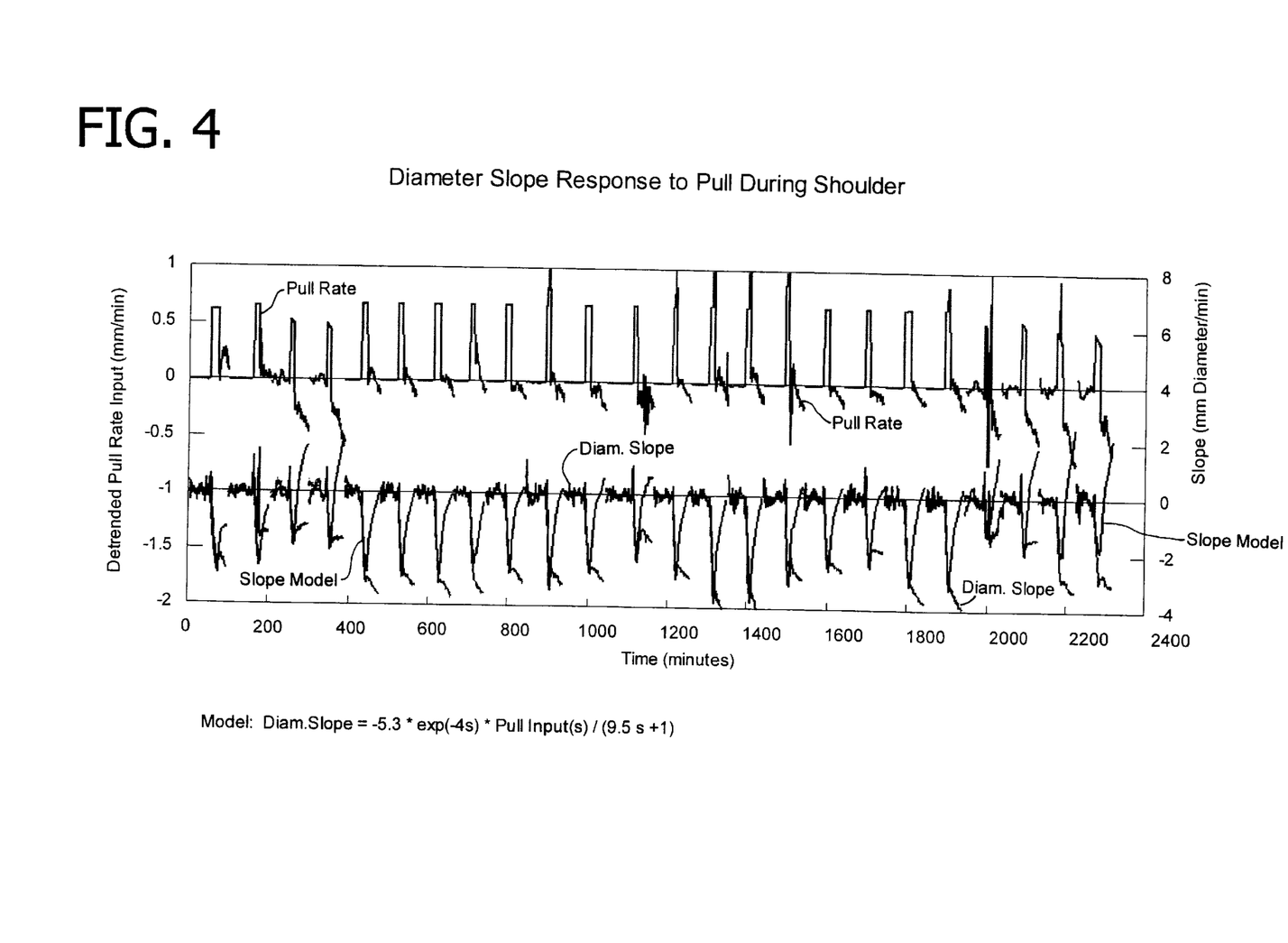
FIG. 4 is graph of exemplary data representing a diameter slope model fitting.

Referring now to FIG. 4, a data set taken from approximately 20 prior runs of a 300 mm crystal growing process provided data regarding growth in the shoulder region for estimating the process dynamics. The data indicates a diameter slope response to pull during shoulder growth (i.e., the transition from taper to body). In this instance, the data is used to define the response characteristics, that is, to determine minimum mean squared error parameter values of $\tau = 9.5$ min., $G_P = -5.3$, and $t_d = 4$ min.

It is contemplated that the estimated diameter slope $\hat{D}_i$ may be generated using a well known best linear estimate. In one embodiment, the present invention uses a quadratic diameter growth model for the taper diameter to generate a time-based estimate using a time series of diameter measurements. The diameter approximation is a polynomial so the slope can be calculated by taking the derivative of the approximation.

Following implementation with PLC 63, the predictive shoulder method of the present invention incorporates the following variables into a decision formula that decides whether the diameter is large enough to initiate shouldering: 1) a statistical estimation of the diameter slope during the last stages of crown growth; 2) filtered pull rate values (if active crown slope control is used); 3) a shouldering seed lift (a constant recipe value); 4) a meniscus diameter adjustment as a function of diameter slope (for a given hotzone design); 5) a current diameter measurement; and 6) estimated process dynamics (time delay, time constant, and gain).

Statistics taken from the historical data indicates initial body diameters from −6 mm below set point to +4.5 mm above set point, with a standard deviation of 5.63 mm. The use of the predictive shoulder roll software of the present invention resulted in a sample standard deviation of 1.2 on eight shoulders. This represents an approximately 4.5 times decrease in variability. Advantageously, such improved results are achieved without any "tuning factors" being required. That is, the shoulder trigger point is based on real-time process data and prior computations alone.

In view of the above, it will be seen that the several objects of the invention are achieved and other advantageous results attained.

As various changes could be made in the above constructions and methods without departing from the scope of the invention, it is intended that all matter contained in the above description or shown in the accompanying drawings shall be interpreted as illustrative and not in a limiting sense.

APPENDIX A

Figure 5:
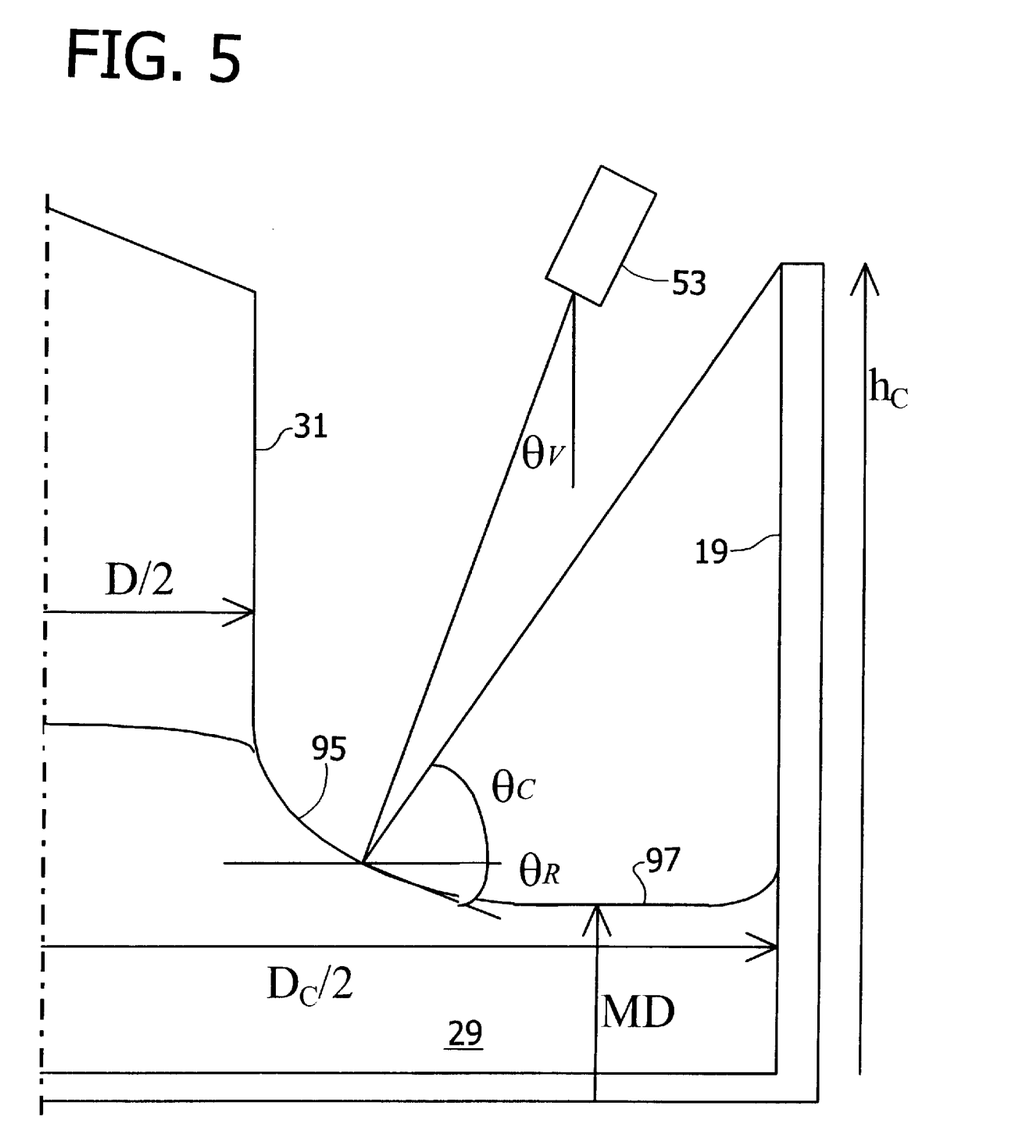
FIG. 5 is a schematic, fragmentary view of a bright ring of the semiconductor crystal being pulled from the melt contained in the crystal puller of FIG. 1.

Referring now to FIG. 5, as crystal drive unit 47 pulls crystal 31 from melt 29, the liquid meniscus 95 forms at the interface between crystal 31 and melt 29. Liquid meniscus 95 forms on the surface 97 of melt 29. As is known in the art, the reflection of crucible 19 on meniscus 95 is often visible as a bright ring adjacent crystal 31. In this diagram:

$$\theta_C \approx \tan^{-1}\left(\frac{2(h_C - MD)}{D_C - D}\right)$$

and $$\pi/2 + \theta_V - \theta_R = \theta_C + \theta_R.$$

-continued

Simplifying $$\theta_R \approx \frac{1}{2}\left[\frac{\pi}{2} + \theta_V - \tan^{-1}\left(\frac{2(h_C - MD)}{D_C - D}\right)\right].$$

D. T. J. Hurle, Analytical Representation of the Shape of the Meniscus in Czochralski Growth, 63 Journal of Crystal Growth 13–17 (1983), describes an approximate analytical relationship for representing the shape of the meniscus and its dependence on the angle of contact at the three-phase boundary and on the crystal radius. By using the separable differential equation provided by the reference:

$$\left[1 + \left(\frac{dy}{dx}\right)^2\right][1 - ay^2]^2 = 1; a = \frac{1}{2}\left(\frac{2}{\beta}\right)^{3/2}\left[1 + \frac{\beta}{2}\frac{\sin\alpha^0}{rh}\right],$$

and the relation $y = \sqrt{(1-\cos\theta_R)/a}$, the meniscus bias $E_D$ may be computed, or:

$$(D, MD, h_C, \theta_V, \theta_S) \Rightarrow \theta_R \Rightarrow (y, h) \Rightarrow [E_D = 2(x-r)].$$

Using published values of these parameters with dimensions from the hotzone, one can fit a quadratic function to the diameter error versus the diameter slope. For example, using the values shown in Table I, below:

TABLE I

Figure 6:
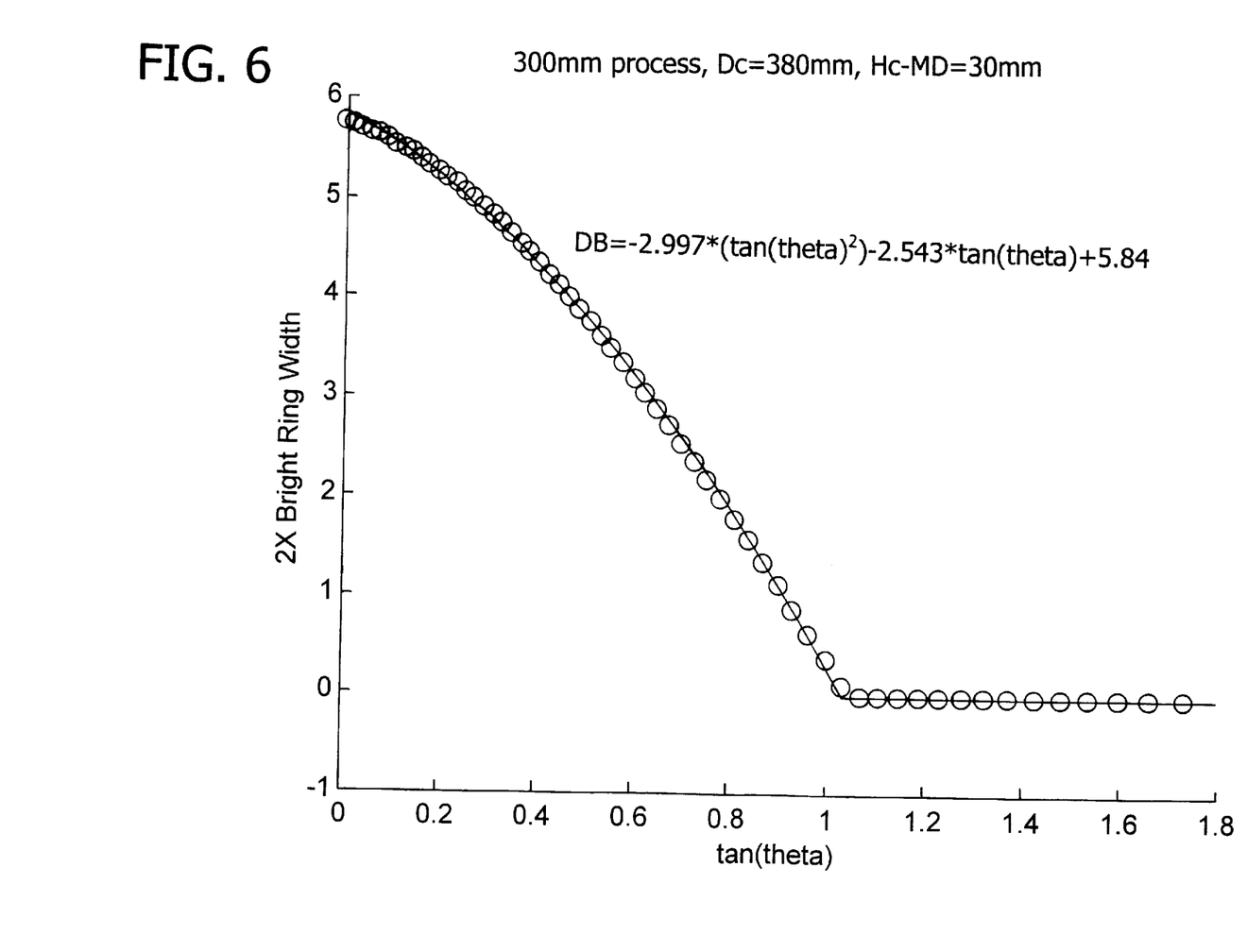
FIG. 6 is graph of exemplary data representing diameter bias versus tangent of diameter slope.

| D | $D_c$ | hc-MD | β |
|---|---|---|---|
| 310 mm | 380 mm | 30 mm | 58 mm² | gives the circular data points in FIG. 6, using Hurle's solution:

$$x = \frac{D}{2} + \sqrt{\frac{2}{a} - h^2} - \sqrt{\frac{2}{a} - y^2} - \frac{1}{\sqrt{2a}}\ln\left[\left(\frac{y}{h}\right)\left(\frac{\sqrt{2-ah^2}}{\sqrt{2-ay^2}}\right)\right]$$

where $h = \sqrt{\beta(1-\cos\alpha^\circ) + (\beta\sin\alpha^\circ/4r)^2} - \beta\sin\alpha^\circ/4r$ represents the meniscus height and $\alpha^\circ = \pi/2 - \theta_L^\circ - \theta_L^\circ = 11^\circ$ for silicon.

In FIG. 6, the angle θ represents the diameter slope of taper 87 (e.g., θ=0 for straight vertical growth). As shown, the data points can be fitted to a polynomial function, in this case a quadratic, yielding a bright ring width DB in terms of the crown slope θ. For this specific melt level and set of process parameters the quadratic estimate is given by: DB=−2.997(tan θ)²−2.543 tan θ+5.84

APPENDIX B

Matlab® Program:

% M-file edest.m, which computes, given hotzone dimensions, % the error in diameter estimate.
beta—58;
thetaL0=11;
hc=30;
T=0;
Dc=380;
MD=0;
D=310;
thetaV=atan((400−D/2)/750);
thetaR=(pi/2+thetaV−atan(2*(hc−MD−T)/(Dc−D)))/2;
thetaSmin=0;thetaSmax=60;stepthetaS=1;
Rc=ceil((thetaSmax−thetaSmin+1)/stepthetaS);

```
edest=zeros(Rc,3);
for thetaS=thetaSmin:1:thetaSmax
    alpha0=pi/180*(90-thetaL0-thetaS);
    h=sqrt(beta*(1-cos(alpha0))+(beta*sin(alpha0)/2/D)
        ^2)-beta* sin(alpha0)/2/D;
    a=(1/beta+sin(alpha0)/D/h);
    y=fmin('menslope',0.001,h,[ ],a,thetaR);
    x=D/2+sqrt(2/a-h^2)-sqrt(2/a-y^2)-log(y/h*(sqrt(2)+
        sqrt(2-a*h^2))/(sqrt(2)+sqrt(2-a*y^2)))/sqrt(2*a);
    if 2*x-D<0.001
        x=D/2;
    end
    edest(thetaS-thetaSmin+1,:)=[thetaS,tan(pi/
        180*thetaS),2*x-D];
end
clf;subplot(111);plot(edest(:,2),edest(:,3),'ro')
fitter=edest(min(find(edest(:,3))):max(find(edest(:,3))),:);
[P,S]=polyfit(fitter(:,2),fitter(:,3),2);
format short e;P,format;
predvals=polyval(P,fitter(:,2));maxerror=max(predvals-
    fitter(:,3))
hold on;plot(fitter(:,2),predvals,'b-');hold off;
grid on;title('300mm process, Dc=310 mm, Hr-MD=50
    mm');ylabel('2×Bright Ring
    Width');xlabel('tan(theta)');
gtext('-2.997*(tan(theta))^2-2.543*tan(theta)+5.84').
```

What is claimed is:

1. A control method for use with a crystal puller for growing a monocrystalline semiconductor crystal according to the Czochralski process, said crystal puller having a heated crucible containing a semiconductor melt from which the crystal is grown, said crystal being grown on a seed crystal pulled from the melt, said method comprising the steps of:

pulling the growing crystal from the melt at a first target pull rate, said first target pull rate substantially following an initial velocity profile for growing a taper portion of the crystal, said taper portion of the crystal having a generally increasing diameter;

measuring the crystal diameter during the taper portion of growth;

estimating a slope of the crystal diameter, said estimated slope being a function of a change in crystal diameter relative to time during the taper portion of growth and the first target pull rate;

predicting a crystal diameter measurement $D_i$ at which to initiate shouldering for growing a body portion of the crystal from the taper portion of the crystal, said shouldering initiation diameter measurement $D_i$ being a function of the estimated slope, said body portion of the crystal having a substantially uniform diameter greater than the predicted diameter measurement $D_i$; and increasing the pull rate to a second target pull rate when the measured crystal diameter reaches the shouldering initiation diameter measurement $D_i$ for controlling a transition from the taper portion of the crystal to the body portion of the crystal, said second target pull rate corresponding to initial growth of the body portion of the crystal.

2. The method of claim 1 wherein the second target pull rate is a substantially constant, predetermined rate.

3. The method of claim 1 wherein the step of predicting the shouldering initiation diameter measurement $D_i$ includes calculating Di according to the following equation:

$$D_i = D_t - \tau\left\{\dot{D}_i + [G_P k - \dot{D}_i]\left(\frac{k}{k - \dot{D}_i/G_P}\right) - G_P k\left[1 + \ln\left(\frac{k}{k - \dot{D}_i/G_P}\right)\right]\right\}$$

where $D_t$ is a final target diameter of the body portion of the crystal, $\dot{D}_i$ is the estimated slope of the crystal diameter, k is a planned increment in the pull rate for shouldering, $\tau$ is a process time constant and $G_P$ is a DC process gain.

4. The method of claim 1 wherein the melt has a surface with a meniscus visible as a bright area adjacent the crystal as the crystal is pulled from the melt and wherein the step of predicting the shouldering initiation diameter measurement $D_i$ includes compensating for a diameter bias resulting from the width of the bright ring.

5. The method of claim 1 wherein the step of predicting the shouldering initiation diameter measurement $D_i$ includes calculating $D_i$ according to the following equation:

$$D_i = D_t - \tau\left\{\dot{D}_i + [G_P k - \dot{D}_i]\left(\frac{k}{k - \dot{D}_i/G_P}\right) - G_P k\left[1 + \ln\left(\frac{k}{k - \dot{D}_i/G_P}\right)\right]\right\} + \Delta DB - \dot{D}_i t_d$$

where $D_t$ is a final target diameter of the body portion of the crystal, $\dot{D}_i$ is the estimated slope of the crystal diameter, k is a planned increment in the pull rate for shouldering, $\tau$ is a process time constant, $G_P$ is a DC process gain, $\Delta DB$ is a diameter bias approximation and $\dot{D}_i t_d$ is an approximation of additional diameter growth that occurs during the time delay.

6. The method of claim 5 wherein the melt has a surface with a meniscus visible as a bright area adjacent to the crystal as the crystal is pulled from the melt and further comprising the step of defining the diameter bias approximation based on a model of the width of the bright ring.

7. The method of claim 6 further comprising the step of defining the diameter bias approximation according to the equation:

$$\Delta DB = \max\left(-\alpha_0, \frac{\alpha_1}{2}\left(\frac{\dot{D}}{V_P}\right) + \frac{\alpha_2}{4}\left(\frac{\dot{D}}{V_P}\right)^2\right).$$

where $\dot{D}_i$ is the estimated slope of the crystal diameter, $V_P$ is the pull rate and $\alpha_0$, $\alpha_1$ and $\alpha_2$ are constants determined from a mathematical model approximating the bright ring width.

8. The method of claim 6 further comprising the step of modeling the bright ring as a polynomial equation, said equation being a function of the slope of the taper portion of the crystal, and the step of defining the diameter bias approximation as a function of a width of the bright ring as modeled by the equation.

9. The method of claim 1 wherein the step of predicting the shouldering initiation diameter measurement $D_i$ includes calculating $D_i$ as a function of one or more of the following variables:

a statistical estimation of the diameter slope during growth of the taper portion of the crystal;

a desired pull rate increment;

a substantially constant shouldering pull rate;

a meniscus bright ring width adjustment as a function of diameter slope;

a current diameter measurement; and estimated process dynamics.

10. The method of claim 1 wherein the step of estimating the diameter slope includes modeling the diameter slope as a first order system plus delay.

11. The method of claim 1 wherein the step of estimating the diameter slope includes generating a polynomial model of the growth of the crystal based on data including a time series of diameter measurements and performing a best linear estimate of the data.

12. The method of claim 1 further comprising the steps of recording diameter measurements from a plurality of prior runs of the crystal puller and hotzone configuration and determining a set of response characteristics corresponding to the crystal puller and wherein the step of estimating the diameter slope includes defining the estimated diameter slope as a function of the response characteristics.

13. A control method for use with a crystal puller for growing a monocrystalline semiconductor crystal according to the Czochralski process, said crystal puller having a heated crucible containing a semiconductor melt from which the crystal is grown, said crystal being grown on a seed crystal pulled from the melt, said method comprising the steps of:

pulling the growing crystal from the melt at a first target pull rate, said first target pull rate substantially following an initial velocity profile for growing a taper portion of the crystal, said taper portion of the crystal having a generally increasing diameter;

measuring the crystal diameter during the taper portion of growth;

estimating a slope of the crystal diameter, said estimated slope being a function of a change in crystal diameter relative to time during the taper portion of growth and the first target pull rate;

predefining a crystal diameter measurement $D_i$ at which to initiate a transition to a body portion of the crystal from the taper portion of the crystal, said body portion of the crystal having a substantially uniform diameter greater than the predefined diameter measurement $D_i$;

determining a second target pull rate as a function of the estimated slope and one or more hotzone parameters, said second target pull rate corresponding to growth of the crystal to achieve the transition to the body portion of the crystal at a target diameter with zero slope; and increasing the pull rate to the second target pull rate when the measured crystal diameter reaches the predefined crystal diameter measurement $D_i$ for controlling a transition from the taper portion of the crystal to the body portion of the crystal.

* * * * *